United States Patent [19]

Holland et al.

[11] 4,181,903
[45] Jan. 1, 1980

[54] HYBRID CASCADE ATTENUATOR

[75] Inventors: Kenneth C. Holland, Portland; Gary W. Reed, Beaverton; Desmond L. Murphy, Portland, all of Oreg.

[73] Assignee: Tektronix, Inc., Beaverton, Oreg.

[21] Appl. No.: 877,776

[22] Filed: Feb. 14, 1978

[51] Int. Cl.² ............................................. H01P 1/22
[52] U.S. Cl. ................................. 333/81 R; 333/172
[58] Field of Search ................... 333/70 CR, 81 R; 323/75 K; 338/203, 308

[56] References Cited

U.S. PATENT DOCUMENTS 3,753,170  8/1973  Holland .......................... 333/81 A Primary Examiner—Alfred E. Smith
Assistant Examiner—Robert E. Wise
Attorney, Agent, or Firm—George T. Noe

[57] ABSTRACT

A high-impedance cascade attenuator device includes a plurality of attenuator stages mounted on a single substrate by means of metallization and thick film processes. The attenuator stages are conventional frequency-compensated voltage dividers designed for high-frequency operation; however, the capacitive compensation is included in the thick film process, and the attenuator components may be trimmed to provide precise impedance ratios so that calibration or circuit adjustments are never required.

7 Claims, 5 Drawing Figures

* LASER TRIMMED

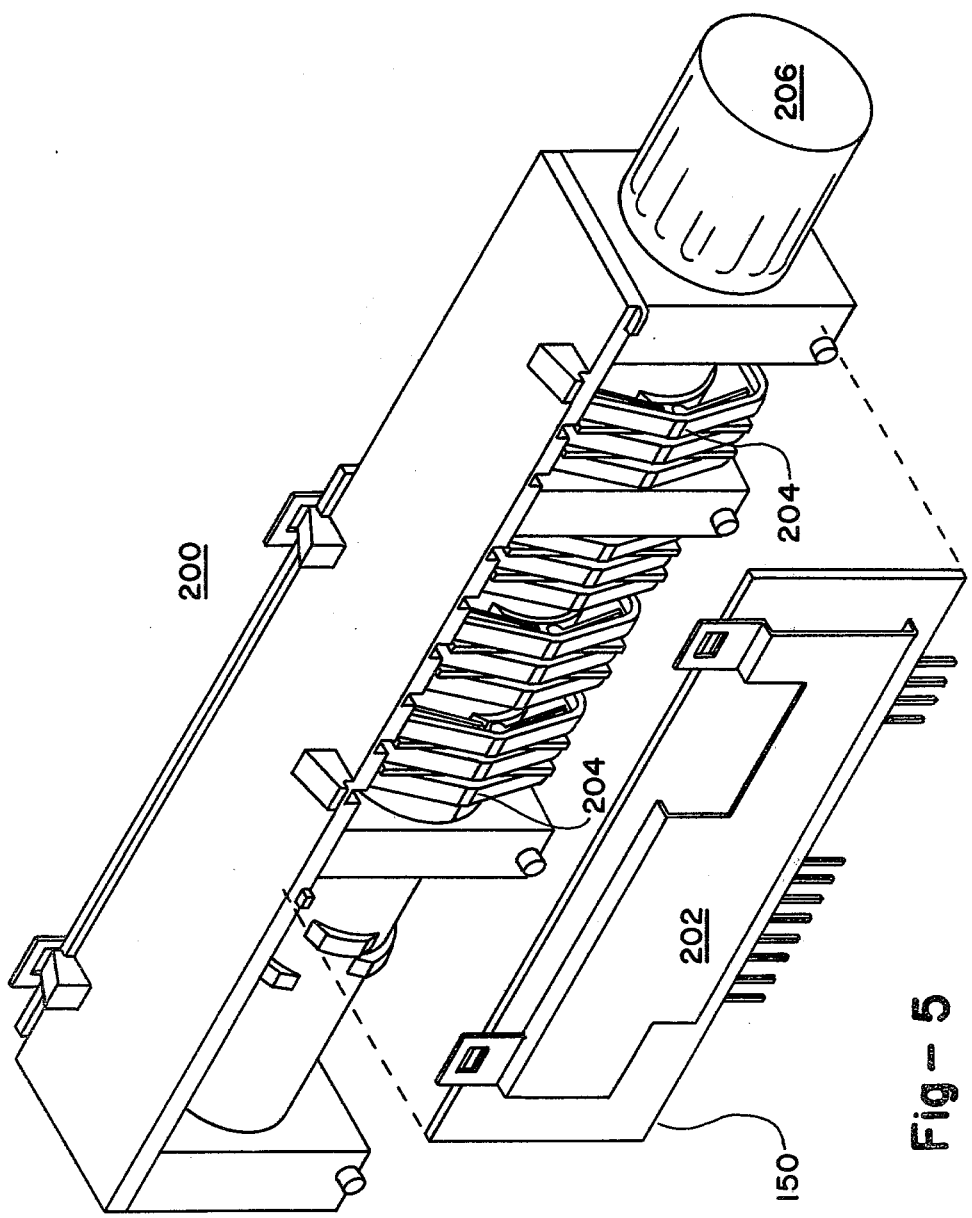

HYBRID CASCADE ATTENUATOR

BACKGROUND OF THE INVENTION

The subject matter of the present invention relates generally to electrical attenuators, and in particular to hybrid cascade attenuators.

The trends in semiconductor and hybrid technology have resulted in electronic instruments which are smaller and lighter in weight, consume less power, and perform higher performance operation with greater reliability. Electro-mechanical devices, such as switches and connectors, have accordingly been miniaturized; however, it is these devices which now physically limit the degree to which the instrumentation functionally may be miniaturized.

In line with these trends, it has become a common practice to employ hybrid passive attenuators which may be mounted directly upon the switch structure. Hybrid attenuators typically comprise a ceramic substrate having circuit paths and passive components deposited thereon by means of metallization and thick film processes. Generally, each attenuator stage is mounted on a separate substrate, and the stages are interconnected by means of strip transmission lines. One example of such an attenuator apparatus is disclosed in U.S. Pat. No. 3,753,170, to Kenneth C. Holland, wherein hybrid passive attenuator elements are mounted directly on a circuit board and the switching is accomplished therebetween by means of cam-actuated circuit-board-mounted contacts.

It is imperative for wide bandwidth instrument operation that various distributed and stray capacitances present in the attenuator be properly compensated to provide precise impedance ratios which are constant from one attenuator stage to the next. It is a usual practice to provide several variable capacitors to facilitate calibration of the attenuator. The standard practice includes application of a square-wave signal to the attenuator and adjusting the capacitors until undershoot or overshoot of the leading edge of the square-wave is eliminated. The procedure must be repeated for each attenuator stage, and some interaction between stages is sometimes experienced which requires readjustment of the variable capacitances.

An attendant problem associated with prior art attenuators was the physical location of such devices, since access to the variable capacitors was necessary for adjustment thereof. This included orienting the attenuator in a particular manner or locating the attenuator near other components which tended to introduce the effects of additional fringe field capacitances and inductances.

SUMMARY OF THE PRESENT INVENTION

In accordance with the present invention, an adjustment-free hybrid cascade attenuator is provided in which a plurality of attenuator stages are mounted on a single substrate by means of conventional metallization and thick film processes. Each attenuator stage includes compensation capacitors fabricated as part of the thick-film process and trimmed to provide a precise impedance ratio by means of a dynamic-operation-and-laser-trim procedure. The laser trim procedure may be extended to all of the cascaded stages of a cascade attenuator in a single operation to provide equal time constants from stage to stage, and thus, uniform precision of all the stages of the attenuator.

The attenuator circuits thus produced are substantially two-dimensional and therefore easier to provide interference shielding for. A ground plane comprising a metalized layer may be deposited on the substrate, and suitably may extend between the attenuator stages as well as around the outside perimeter of the substrate. A shield may be disposed adjacent the back of the substrate in a plane generally parallel to the plane in which the circuits lie. Switch contact pads may be disposed on the substrate coplanar with the circuits, and the substrate may be mounted directly on a switch structure so that the attenuator stages are selectively connected in cascade by switch contacts thereon. No particular orientation or location of the attenuator within the instrument is necessary because no adjustable components are included in the circuits and thus there is no need for access to the circuits.

It is therefore one object of the present invention to provide a novel hybrid cascade attenuator in which a plurality of attenuator stages are disposed on a single substrate.

It is another object to provide a hybrid high-impedance attenuator in which capacitive compensation is included as part of the thick film process, thereby precluding the necessity of providing adjustable components.

It is a further object to provide a hybrid high-impedance attenuator in which impedance elements may be accurately trimmed to provide precise impedance ratios.

It is an additional object to provide an improved cascade attenuator in which all of the attenuator circuits are substantially two-dimensional and substantially coplanar to optimize high frequency characteristics and reduce electrical interference.

It is yet another object to provide a hybrid cascade attenuator of reduced size and for which physical location is non-critical.

Other objects and advantages of the present invention will become apparent to those having ordinary skill in the art when taken in conjunction with the accompanying drawings.

DRAWINGS

FIG. 5 is a perspective view of a switch assembly with the attenuator of FIGS. 1 and 3 mounted thereon.

DETAILED DESCRIPTION OF THE DRAWINGS

Figure 1:
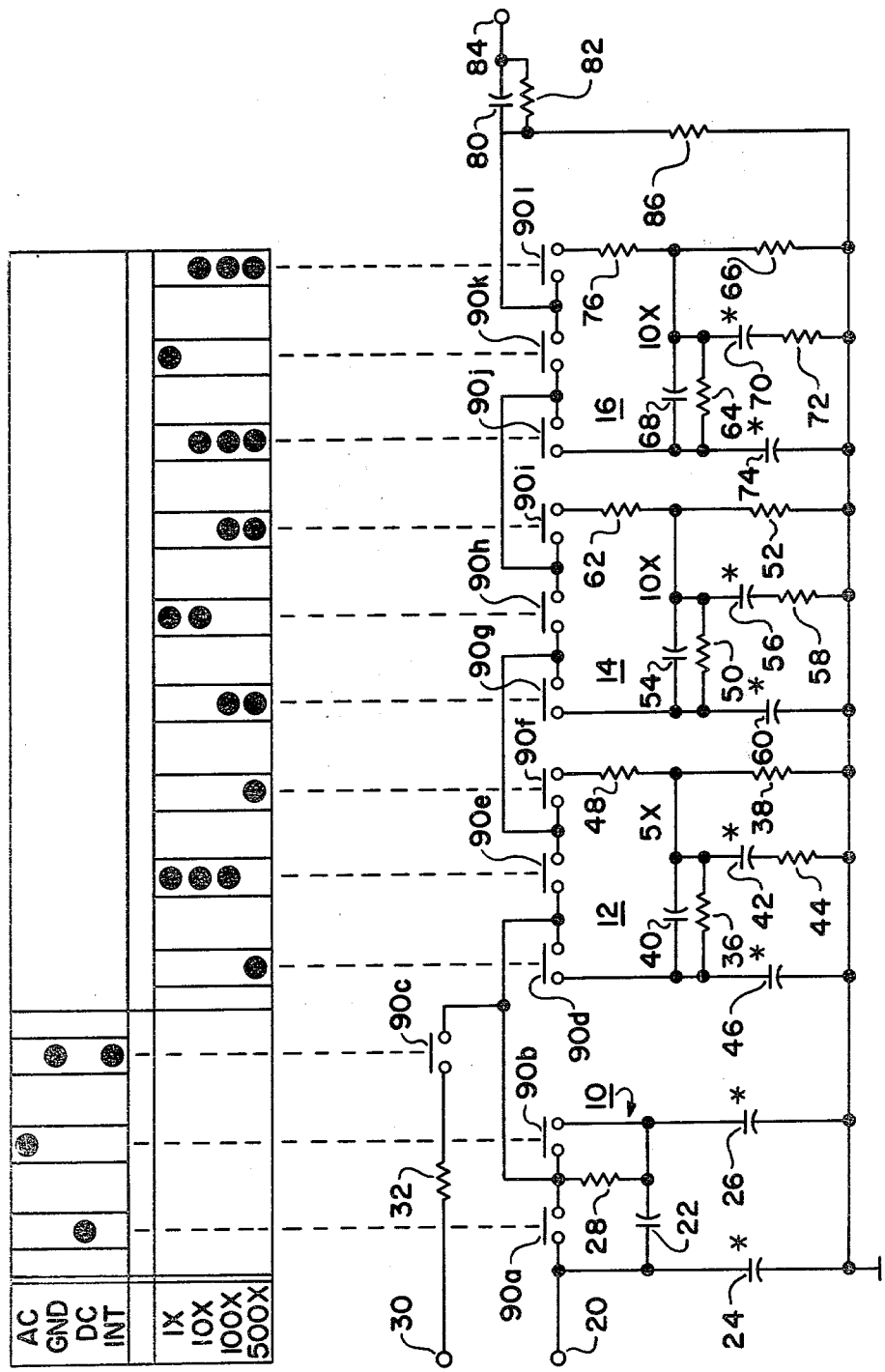
FIG. 1 shows a schematic of a three-stage cascade attenuator made in accordance with the present invention and the switching therefor.

As shown in FIG. 1, one embodiment of an attenuator apparatus in accordance with the present invention includes an input coupling stage 10 and three attenuator stages 12, 14, and 16 having attenuation ratios of 5:1, 10:1, and 10:1 respectively. These stages are formed on an insulative substrate base member using conventional thick film techniques to provide a hybrid attenuator which is mounted on a switch assembly having camactuated contacts as shown in FIG. 5.

A first input terminal 20 permits an input signal to be applied to the input coupling stage prior to being applied to the subsequent attenuator stages. The input coupling stage 10 includes a coupling capacitor 22 of about 0.022 microfarads to be serially connected into the signal path. A pair of shunt capacitors 24 and 26 are connected to ground from the input and output sides of the coupling capacitor, and have nominal values of 2.2 and 0.6 picofarads respectively. A resistor 28 of about 700 kilohms is serially connected into the circuit to provide a pre-charging path for the coupling capacitor.

A second input terminal 30 permits an input signal to be applied via a resistor 32 of about 56 ohms directly to the attenuator stages, bypassing the input coupling stage 10.

The attenuator stages are conventional frequency-compensated voltage dividers for attenuating wide frequency bandwidth signals, for example, DC to 100 megahertz, to levels suitable for processing by following circuitry, such as a vertical amplifier of an oscilloscope. The 5X attenuator stage 12 includes voltage divider resistors 36 and 38, which are formed using conventional thick film techniques and trimmed to values of 800 kilohms and 250 kilohms respectively. Resistor 36 is paralleled by capacitor 40 of about 5 picofarads, while resistor 38 is paralleled to ground by the serial combination of capacitor 42 of about 9.5 picofarads and resistor 44 of about 167 ohms. A shunt capacitor 46 of about 5.8 picofarads is connected across the attenuator 12 input to ground. The attenuator 12 output is provided via a series resistor 48 having a value of about 91 ohms.

The first 10X attenuator stage 14 includes voltage divider resistors 50 and 52, which are trimmed to values of 900 kilohms and 111.11 kilohms respectively. Resistor 50 is paralleled by capacitor 54 of about 4.4 picofarads, and resistor 52 is paralleled to ground by the serial combination of capacitor 56 of about 31.5 picofarads and resistor 58 of about 10 ohms. A shunt capacitor 60 of about 4.3 picofarads is connected across the attenuator 14 input to ground. The attenuator 14 output is provided via series resistor 62 having a value of about 25 ohms.

Similarly, the second 10X attenuator stage 16 includes voltage divider resistors 64 and 66, which are trimmed to values of 900 kilohms and 111.11 kilohms respectively. Resistor 64 is paralleled by capacitor 68 of about 4.4 picofarads, and resistor 66 is paralleled to ground by the serial combination of capacitor 70 of about 33.5 picofarads and resistor 72 of about 36 ohms. A shunt capacitor 74 of about 2.8 picofarads is connected across attenuator 16 input to ground. The attenuator 16 output is provided via a series resistor 76 having a value of about 100 ohms.

The overall attenuator output is available via the parallel combination of capacitor 80 and resistor 82 at output terminal 84. A one megohm resistor 86 connected between the signal path and ground establishes the input resistance for "straight-through", or unattenuated signals.

Figure 3:
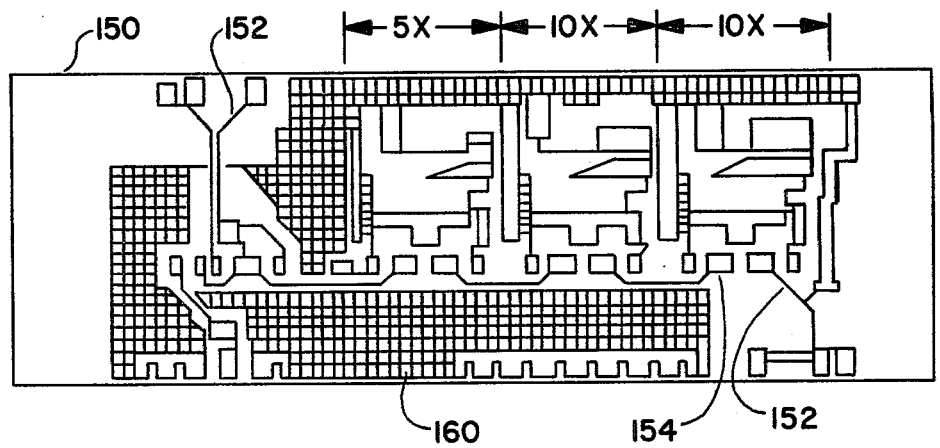
FIG. 3 is a plan view of a physical embodiment of the circuit of FIG. 1 showing the arrangement of attenuator components on a substrate.

The entire attenuator as herinabove described is formed on an insulative substrate base member using conventional thick film techniques to provide a hybrid attenuator as shown in FIG. 3, which attenuator is mounted on a switch assembly having cam-actuated contacts as shown in FIG. 5.

FIG. 1 shows a logic diagram of such a cam-actuated switch for actuating a plurality of contacts 90a–90l wherein the actuating cam lobes are represented as black spots. The switch may suitably be divided into two independent sections, one for input coupling selection, and the second for selecting one of four attenuation multipliers, 1X, 10X, 100X, or 500X. For example, for DC coupling and no attenuation (1X), contacts 90a, 90e, 90h, and 90k are actuated, providing the appropriate switch closures with metallic pads on the hybrid substrate to establish a straight-through signal path. For 10X attenuation, contacts 90e, 90h, 90j, and 90l are actuated. Similarly, for 100X and 500X attenuation, the appropriate switch closures are made in accordance with the switch logic diagram.

In the present hybrid attenuator, the capacitive compensations of the frequency-compensated voltage dividers are preset in the manufacturing process. Thus, capacitors 24, 26, 42, 46, 56, 60, 70, and 74, identified in FIG. 1 by an asterisk (*), are laser trimmed under dynamic operating conditions in the manufacturing process to provide precisely "adjusted" capacitors which never need readjustment, precluding lengthy calibration procedures. These trimmable capacitors are formed as part of the thick film process, being a pair of metalized layers separated by a dielectric film, and are of the configuration shown in FIG. 4.

Figure 2:
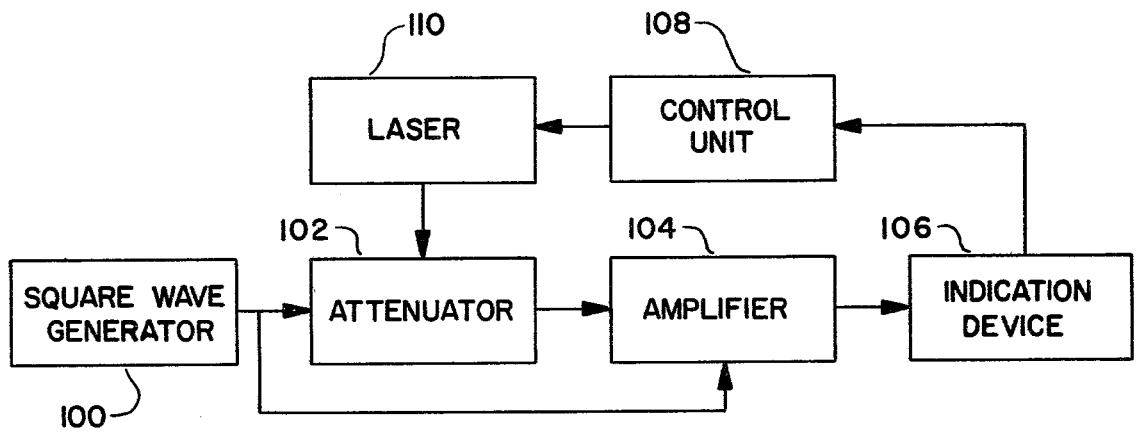
FIG. 2 shows a block diagram of a circuit for checking the operation of the attenuator of FIG. 1.

FIG. 2 shows a block diagram of a system utilized in the manufacturing process for checking the operation of the attenuator of FIGS. 1 and 3. A square-wave generator 100 produces a square-wave signal having a predetermined amplitude and repetition rate, which signal is applied to an input terminal of attenuator 102. Attenuator 102 includes the circuitry of FIG. 1 described hereinabove, and such attenuator is placed in jig (not shown) which closely approximates the actual environment in which the attenuator will be operated when installed in an instrument with regard to stray capacitances and E.M.I. and R.F. shielding.

The attenuator output is amplified to a suitable level by amplifier 104 and applied to an indication device 106. Because of the series and shunt capacitive frequency compensation utilized in the attenuators, an incorrect capacitive divider ratio will result in either a differentiation or integration effect on the leading edge of the applied square wave. This phenomenon is known in the art as "overshoot" or "undershoot" respectively, and is observable on the indicator device. The capacitive divider ratio is precisely adjusted when the square-wave signal passes through the attenuator without distortion. In the present invention, the shunt capacitors of the capacitive dividers, viz., capacitors 24, 26, 42, 46, 56, 60, 70, and 74 of FIG. 1, are intentionally fabricated having an excess of plate area which may be subsequently laser trimmed to the correct size to provide precise divider ratios. The indication device 106 provides an indication of the distortion of the square-wave signal, and produces a signal proportional to the amount of distortion which is applied to a control unit 108. The control unit 108, which suitably may be a microprocessor or the like, provides control signals to a laser 110, which operates to trim the aforementioned capacitor plates until the square-wave signal passes through the input coupling and attenuator portions of attenuator 102 without distortion at which point the capacitive divider ratio is correctly adjusted. Amplifier 104 and indication device 106 suitably may be an indicator circuit such as that disclosed in U.S. Pat. No. 4,070,615, and assigned to the assignee of the present invention, wherein amplifier 104 is a comparator which compares the attenuator output with the original square-wave signal, and produces a signal indicative of any distortion caused by the attenuator. Thus the indication device 106 may produce a control voltage proportional to the distortion to be input to the control unit 108.

A hybrid attenuator embodying the circuit of FIG. 1 is shown in FIG. 3. This attenuator is fabricated on an insulative substrate 150 utilizing conventional thick film techniques. Substrate 150 suitably may be a ceramic such as alumina to which a first conductive metal is applied to provide conductive circuit paths 152, switch contact pads 154, and the lower plates of the capacitors in the input coupling and attenuator sections. Next, the lower capacitor plates are overlaid with a dielectric film, then the second conductive metal layer is applied to provide the upper capacitor plates and the ground plane grid 160. Such a grid provides an effective ground plane while conserving the amount of metal deposited, which is an important consideration where a precious metal such as gold is utilized as the second conductive layer. Next, appropriate resistive films and an encapsulant are applied to complete the hybrid structure. The procedure outlined hereinabove regarding the hybrid manufacturing process is conventional and well known to those skilled in the art, although it is believed that the capacitor structures and the ground plane grid are unique. The materials and processing have been selected to provide high stability of both resistance and capacitance values.

Figure 4:
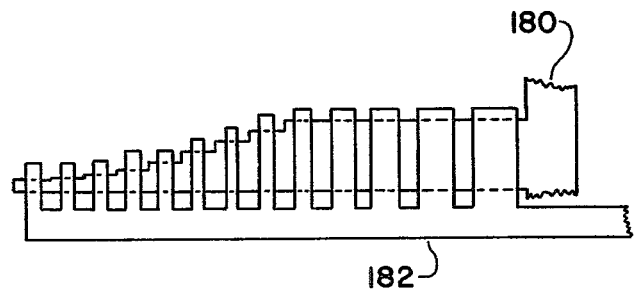
FIG. 4 is an enlarged portion of the plan view of FIG. 3 showing a trimmable capacitor.

An enlarged portion of the plan view of FIG. 3 showing the structure of a trimmable capacitor is shown in FIG. 4. The lower capacitor plate 180 and upper capacitor plate 182 are separated by a dielectric film (not shown), forming a parallel-plate capacitor. It is well known that the capacitance value C of such a capacitor is $C = K\epsilon_o A/d$, where K is the dielectric constant of the dielectric film, $\epsilon_o$ is the permittivity of free space, A is the plate area of the parallel plates, and d is the thickness of the dielectric film. Once the capacitor structure is complete, the capacitance value can only be changed by altering the plate area. Therefore, the plate area is designed to be larger than necessary so that an adjustment to correct value can be achieved by laser trimming away a portion of the plate area. To facilitate such a laser trimming adjustment, the upper plate 182 includes a plurality of elongate segments laid out in a geometric progression of area parallel to the lower plate 180. The segments are connected together by a common bus at one end thereof. The correct plate area A is arrived at by disconnecting the appropriate segments from the bus.

In the present invention, thirteen segments are utilized providing a plate area ratio of 1.25:1 between segments. Utilizing a dynamic-operation and laser-trim procedure as outlined hereinabove in connection with FIG. 2, this arrangement provides a capacitor trimmable from up to 30 percent oversize to within 0.2 percent of precise value without having to know the correct final value before any trims are made, such as would be the case where the segment values are arranged in a power-of-two progression.

By using equal time constants in each attenuator section, the capacitors of all three attenuator sections may be trimmed identically, and further, parasitic capacitance effects may be trimmed out.

FIG. 5 is a perspective view of a switch assembly 200 having the attenuator of FIGS. 1 and 3 mounted thereon. Substrate 150 is shown mounted to the switch assembly such that the thick film components described hereinabove are facing inwardly toward the switch. A shield 202 is attached to the backside of the substrate 150 to shield the attenuators from electrical interference. Switch assembly 200 is of the type having a cam drum actuating device (not shown) and a plurality of bonded elastomeric contacts 204 for engaging the appropriate contact pads 154 (see FIG. 3) to make the proper switch closures in accordance with the input coupling and attenuation ratio chosen. The switch assembly suitably may be mounted in an instrument so that a knob 206 is available at the front panel thereof for rotating the cam drum and thereby providing the desired switch position selection. No particular orientation or location of the attenuator within the instrument is necessary because no adjustable components are included in the circuits and thus there is no need for access to the circuits.

It will be obvious to those having ordinary skill in the art that many changes may be made in the details of the above-described preferred embodiment of the present invention. Therefore, the scope of the present invention should only be determined by the following claims.

What we claim as novel is:

1. An attenuator device, comprising:
   an insulative substrate having a substantially planar surface;
   a plurality of resistive elements disposed on said substrate surface; said resistive elements comprising resistive film;
   a plurality of parallel plate capacitors disposed on said substrate surface; each of said capacitors comprising a lower plate having a predetermined configuration, an upper plate having a predetermined configuration defining a series of segments of predetermined area connected together at one end by a common bus, and a dielectric film disposed intermediate said lower and upper plates; and
   a plurality of conductive circuit paths disposed on said substrate surface interconnecting said resistive elements and said capacitors to form a plurality of coplanar attenuator circuits of different attenuation values.

2. An attenuator device in accordance with claim 1 wherein said segments of said upper plate are arranged in a geometric progression of area size, said segments being selectively disconnectable from said bus.

3. An attenuator device in accordance with claim 1 further including a conductive ground plane deposited on said substrate substantially coplanar with said attenuator circuits and extending therearound, said conductive ground plane having a grid configuration.

4. An attenuator device in accordance with claim 1 including shield means secured to said substrate in a plane parallel to said planar surface.

5. A capacitor for disposition on a substrate, comprising:
   a lower conductive plate disposed on said substrate;
   a dielectric medium disposed on said lower plate, said dielectric medium having a predetermined uniform thickness and a predetermined dielectric constant; and
   an upper conductive plate disposed on said dielectric medium, said upper plate having a predetermined plan configuration whereby selective portions of said upper plate extend parallel to said lower plate to form a parallel-plate capacitor, said selective portions being selectively disconnectable from said upper plate to change the capacitance value of said capacitor.

6. A capacitor in accordance with claim 5 wherein said upper plate has a predetermined configuration defining a series of segments connected together by a common bus, whereby said segments are selectively disconnectable from said bus.

7. A capacitor in accordance with claim 6 wherein said segments are arranged in a geometric progression of area size.

* * * * *